United States Patent [19]
Wendell

[11] Patent Number: 5,915,084
[45] Date of Patent: Jun. 22, 1999

[54] SCANNABLE SENSE AMPLIFIER CIRCUIT

[75] Inventor: Dennis L. Wendell, Pleasanton, Calif.

[73] Assignee: Advanced Micro Devices, Inc., Sunnyvale, Calif.

[21] Appl. No.: 08/938,734

[22] Filed: Sep. 26, 1997

Related U.S. Application Data

[60] Provisional application No. 60/027,329, Sep. 30, 1996.

[51] Int. Cl.[6] ................................................ G11C 11/40
[52] U.S. Cl. ............................ 395/183.06; 371/22.31; 365/201
[58] Field of Search .............................. 371/21.1, 22.31, 371/22.36, 22.5, 70; 365/201, 205; 395/183.06, 555

[56] References Cited

U.S. PATENT DOCUMENTS

| | | | |
|---|---|---|---|
| 4,314,353 | 2/1982 | Gunter et al. | 395/306 |
| 5,414,714 | 5/1995 | Gladden et al. | 371/22.36 |
| 5,485,466 | 1/1996 | Lyon et al. | 371/22.36 |
| 5,608,681 | 3/1997 | Priebe et al. | 365/207 |

OTHER PUBLICATIONS

Hodges et al., *Analysis and Design of Digital Integrated Circuits*, McGraw Hill Publishing Company, 1988, pp. 24–25 and 311.

*Primary Examiner*—Meng-Ai T. An
*Assistant Examiner*—John Follansbee
*Attorney, Agent, or Firm*—Skjerven, Morrill, MacPherson, Franklin & Friel LLP

[57] ABSTRACT

A plurality sense amplifiers have first and second internal nodes representing respectively, true and complement values of a latched value. A plurality of transfer circuits are provided with one of the transfer circuits disposed between and coupled to each adjacent pairs of the sense amplifiers. The transfer circuits transfer true and complement values between a previous and a next sense amplifier, thereby providing a scannable sense amplifier.

17 Claims, 10 Drawing Sheets

SCANNABLE SENSE AMPLIFIER CIRCUIT

CROSS-REFERENCE TO RELATED APPLICATIONS

This application claims the benefit under 35 U.S.C. §119 (e) of U.S. Provisional Application Ser. No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

This application also relates to application Ser. No. 08/938,393 (attorney docket number M-5248 U.S.), by Dennis L. Wendell, filed the same day as the present application and entitled "Efficient On-Pitch Scannable Sense Amplifier" which application is incorporated herein by reference in its entirety.

BACKGROUND OF THE INVENTION

1. Field of the Invention

This invention relates to semiconductor products and more particularly to memory arrays utilizing sense amplifier circuits.

2. Description of the Related Art

Large memory arrays are used for storage of data and program values in conventional computer systems. In order to increase the amount of data that can be stored in memories, the memory cell which stores the digital value is typically made as small as practical. Bit lines are used to convey the information stored in the storage cells when the memory array is read. However, the voltage differences between a one and a zero, typically represented as a differential voltage on the bit lines is relatively small due to the desire to keep the size of the memory cell small. Therefore, sense amplifier circuits are used to sense whether the stored value represents a digital zero or a one and to amplify the signal to a voltage value which can be used by other circuitry utilizing the stored data and program values.

In addition to functioning as a sense amplifier, some designs have exploited the sense amplifiers for testing purposes to provide greater test visibility into the memory array than available with other test techniques. Particularly, one test approach provides for scan access to the sense amplifiers used in the memory array. Such an approach arranges the sense amplifiers into a scan chain so that the values in the sense amplifiers can be serially shifted (or scanned) through the scan chain until the shifted values are made available to an external observer. However, scanning typically requires a two flip-flop or latch configuration for each data bit desired to be shifted out.

Thus, designs such as the one shown in FIG. 1, showing several sense amplifiers configured in a scan chain, have been utilized for scanning sense amplifiers. Once data has been read from the storage array into sense amplifiers 101, 102 and 103, the data may be shifted into slave flip-flops 104, 105 and 106 on assertion of clock 107. The data may then be shifted through the scan chain by alternately applying clock 110 to shift data into the master flip-flops from the slave flip-flops and clock 107 to shift data into the slave flip-flops. The sequence of alternate clocks is applied until data has been shifted completely through the scan chain.

The approach shown in FIG. 1 requires an extra (or shadow) flip-flop for each sense amplifier. That approach is costly because the extra flip-flop occupies an area in each column of the array which can be comparable to the size of the sense amplifier itself. Further, the inclusion of the slave flip-flop can slow down the normal operation of the sense amplifier because of the increased wiring required to connect to the slave flip-flop to the sense amplifiers.

In order to eliminate the need for the slave sense amplifiers, another prior art sense amplifier scan approach configures alternate sense amplifier latches as master and slave latches such that alternate sense amplifier latches are allowed to overwrite data stored in a next adjacent latch. However, such prior art techniques have not considered efficient design of such master/slave latches. Thus, there is a need to provide a scan approach for sense amplifiers that addresses the issue of circuit minimization and efficiency in addition to the desire to avoid costly extra logic.

SUMMARY OF THE INVENTION

Accordingly, in one embodiment of the invention, plurality sense amplifiers are provided having internal nodes representing true and complement values of a latched value. A plurality of transfer circuits are provided with one of the transfer circuits disposed between and coupled to each adjacent pair of the sense amplifiers. The transfer circuits transfer true and complement values between a previous and a next sense amplifier.

According to another embodiment of the invention, a method is provided for scanning a plurality of sense amplifiers of a memory array coupled in a scan chain. The plurality of sense amplifiers includes a first group of sense amplifiers and a second group of sense amplifiers, each of the sense amplifiers being coupled to a next one of the sense amplifiers via a respective one of a plurality of transfer circuits, the transfer circuits including a first group and a second group. The method includes asserting a first transfer signal coupled to the first group of transfer circuits to provide a first group of signals respectively held in the first group of sense amplifiers to the second group of sense amplifiers. A second sense amplifier clock is asserted to store respective ones of the first group of signal values into the second group of sense amplifiers, thereby shifting the first group of signals from the first group of sense amplifiers to the second group of sense amplifiers.

Implementation is efficient because the transfer circuits are implemented in one embodiment using only a pair of NMOS transistors added to column pitched circuits between adjacent sense amplifiers.

BRIEF DESCRIPTION OF THE DRAWINGS

The present invention may be better understood, and its numerous objects, features, and advantages made apparent to those skilled in the art by referencing the accompanying drawings wherein the use of the same reference symbols in different drawings indicates similar or identical items.

DESCRIPTION OF THE PREFERRED EMBODIMENT(S)

Figure 1:
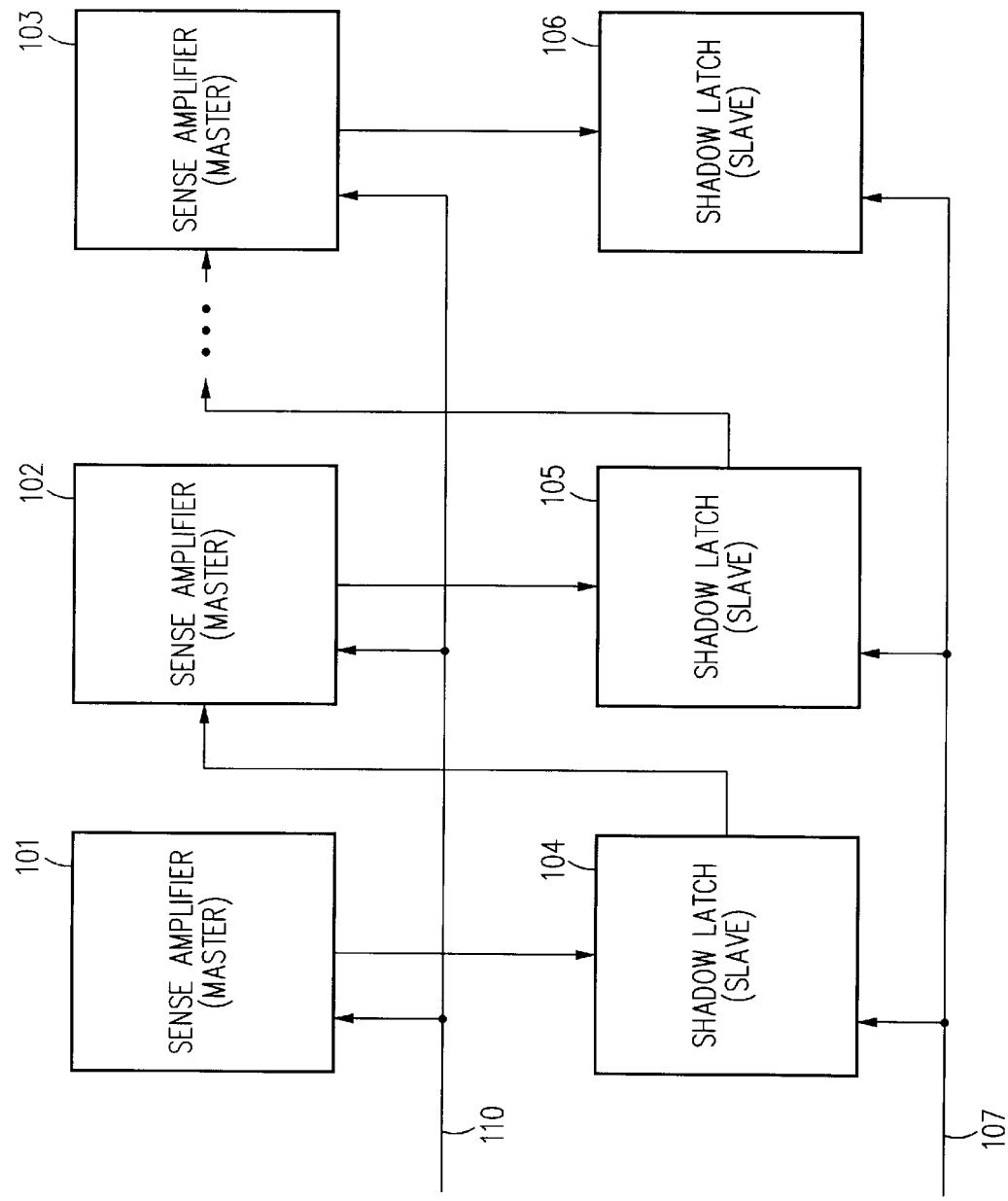
FIG. 1 shows a prior art sense amplifier scan technique employing shadow slave flip-flops.
Figure 2:
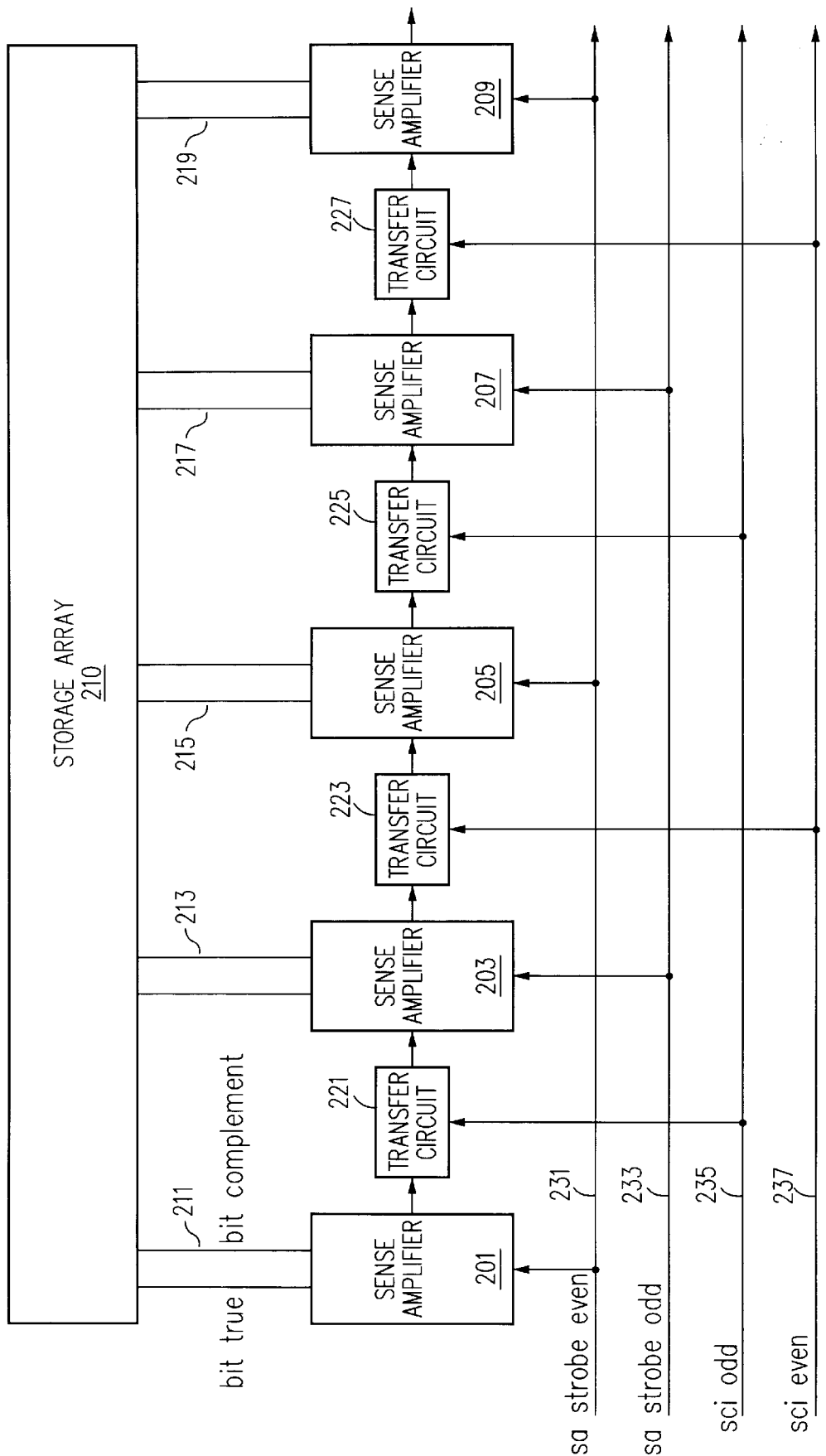
FIG. 2 shows a block diagram of sense amplifiers and transfer circuits and associated clocks according to the present invention.

Referring to FIG. 2, a block diagram of sense amplifiers configured in a scan chain according to the present invention is shown. A plurality of sense amplifiers 201 through 209 are coupled to storage array 210 through respective bit line pairs 211 through 219. In the illustrated embodiment, the bit lines pairs represent the bit true and bit complement value of the value stored in the storage array. The number of sense amplifiers shown is intended to represent a subset of the sense amplifiers found in a typical memory array which typically can be of the order of 128 or 256 or greater. Transfer circuits 221 through 227 are disposed between adjacent sense amplifiers to couple one sense amplifier to another sense amplifier for scan purposes. In addition, clock signals 231 and 233 are provided to the sense amplifiers. Clock signal 231, sense amp (sa) strobe even is coupled to the even numbered sense amplifiers which in the illustrated embodiment are sense amplifiers 201, 205 and 209. The designation of odd and even sense amplifiers may vary. Clock signal 233, sense amp (sa) strobe odd, is coupled to the odd sense amplifiers. The sense amplifier strobe signals 231 and 233 are used both functionally, to latch in values represented by the bit lines during a read of storage array 210 and are also utilized in scan operation of the sense amplifiers. The transfer circuits are also separated into alternate odd and even groups with each group coupled to different transfer signals to provide for scan capability. Thus, transfer circuits 221 and 225 are coupled to scan in odd (sci odd) signal 235 while transfer circuits 223 and 227 are coupled to scan in (sci) signal 237. The sci odd and even signals act as enables which should be setup before the appropriate clock—sense amp strobe odd or even.

Figure 3:
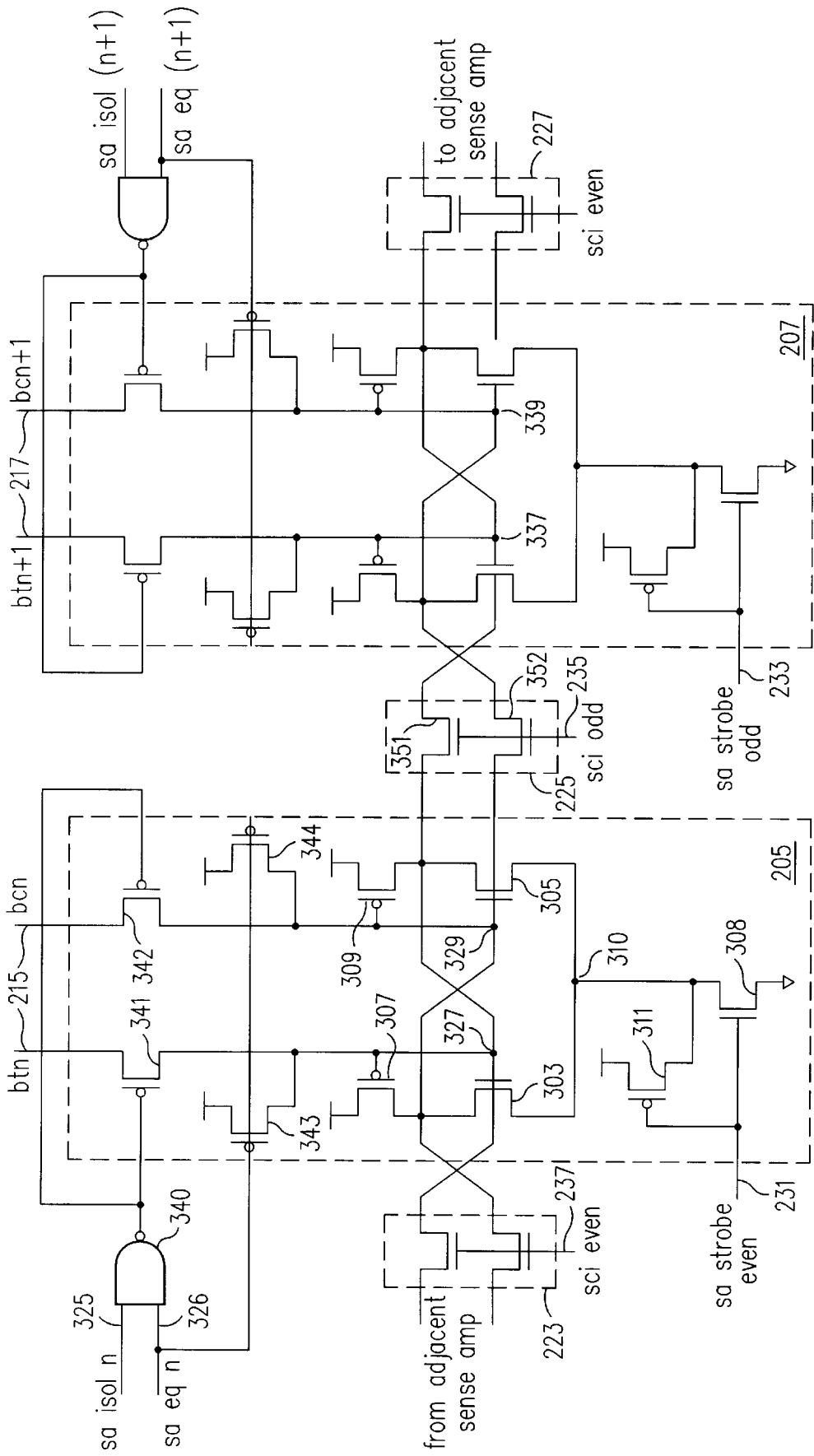
FIG. 3 shows a circuit diagram of the sense amplifiers and transfer circuits according to the invention.

FIG. 3 shows a detailed circuit diagram of two of the sense amplifiers and three of the transfer circuits of FIG. 2 according to one embodiment of the invention. Sense amplifier 205 is coupled to bit lines (bit true-btn) and (bit complement-bcn) 215. Isolation transistors 341 and 342 isolate the sense amplifier from the bit lines except when the sense amplifier is sensing the voltage contained on the bit lines. The isolation strobe 325 is logically combined in NAND gate 340 with an equilibrate signal 326. The equilibrate signal 326, when asserted, causes the internal sense amplifier nodes 327 and 329 to be pulled up to $V_{DD}$.

When the sense amplifier is sensing the voltage on the bit lines, the voltage differential will be sensed by use of the cross coupled NMOS transistors 303 and 305 and PMOS transistors 307 and 309 which are coupled to $V_{DD}$. The sensed value will be latched at a voltage with a significantly greater differential than present on the bit lines, e.g., at close to 0 or $V_{DD}$ according to the voltage on the bit lines. The sensed value is latched upon application of the sense amp strobe even signal 231 to latching transistor 308. In the illustrated embodiment, once sense amp strobe 231 is brought low, node 310 is pulled high through transistor 311. Sense amplifier 207 which is coupled to bit lines 217 (bit (n+1) and bit complement (n+1)), functions in a manner identical to sense amplifier 205.

In order to couple the sense amplifiers into a scan chain without incurring the overhead of shadow latches, transfer gates 223, 225 and 227 may be used. Because it is desirable to try and minimize the circuitry for the transfer gates, each transfer gate is implemented in the illustrated embodiment using only a pair of NMOS transistors. The transfer gates may be added to column pitched circuits between adjacent sense amplifiers as described further herein. Auxiliary control circuits (not shown) activate sense amplifier strobes in odd even combinations to serially shift data through the chain.

Figure 4:
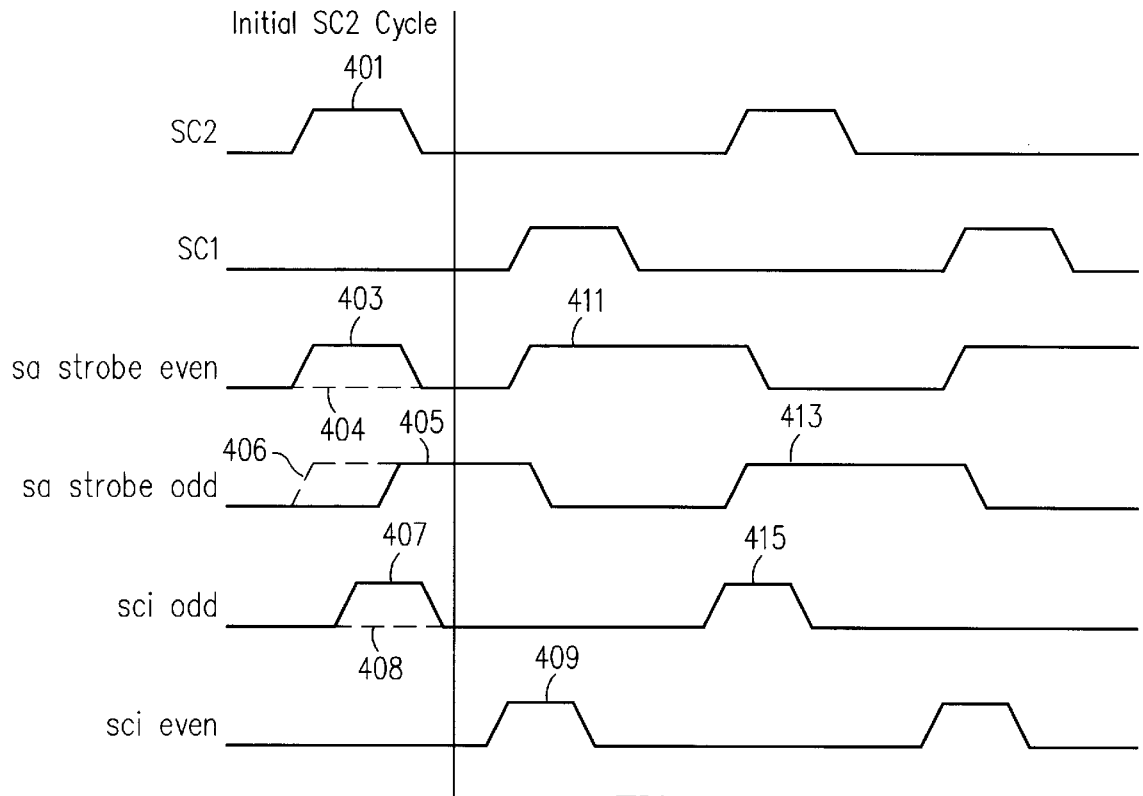
FIG. 4 shows a timing diagram of the clocks used in FIGS. 2 and 3.

A timing diagram of a scan operation according to one embodiment of the invention in shown in FIG. 4. SC2 and SC1 clocks, which refer to scan clocks, which are typically nonoverlapping, are used to serially shift data through scan chains contained on the integrated circuit as is known in the art. In the illustrated embodiment, at the beginning of a scan cycle, the initial SC2 clock will load the sense amplifiers by activating those sense amplifiers that were active on the preceding read cycle. That may be accomplished by recirculating the read address most recently used in a read operation. In one embodiment, that recirculation may be accomplished by using a multiplexer on the input to the address registers of the memory array such that an initial SC2 scan clock causes a recirculated address value to be loaded back into the memory latches.

In a test or debug environment, a typical scenario to analyze the memory is as follows. Address and appropriate memory control information is scanned into the integrated circuit to set up a memory read operation. A system clock may then be applied to clock the address and control information into the memory. A subsequent scan operation causes the address of the recent read to be reloaded on the first SC2 clock cycle of the subsequent scan operation to activate the same sense amplifiers that were previously activated on the prior read operation.

The sense amplifiers that receive the sense amp strobe signals will be either those designated as even or those designated as odd. A particular address should map to either even or odd columns and thus even or odd sense amplifiers. Thus, in one example, several bits of the address may be used to determine if an address maps to even or odd columns so it is known whether to assert even or odd sense amp strobes. Note that all even or all odd sense amplifiers may not be activated on a particular read operation since the read operation may involve, e.g., only one fourth of the columns in the storage array. However, for scanning purposes, either all the even or all the odd sense amplifiers receive a latch strobe on the first SC2 cycle if the previous read address corresponded to even or odd columns, respectively.

Referring to FIG. 4, a scan operation when the last read address was an address that used columns and associated sense amplifiers designated as even is considered. During the initial SC2 cycle 401 as shown in FIG. 4, if the last address read was an even address, the sa strobe even signal 403 is asserted causing the value represented by the voltages on respective true and complement bit lines supplied to even sense amplifiers to be latched in the even sense amplifiers. Referring to the circuit shown in FIG. 3, the sa strobe even signal causes the values on true and complement bit lines 215 to be latched into the flip flop formed by cross coupled NMOS transistors 303 and 305. Note that the isolation strobe 325 must be asserted to couple the bit lines into the sense amplifier. In the illustrated embodiment, the isolation strobe is asserted during the SC2 clock and is active during at least the initial portion of sa strobe even signal 403.

Towards the end of the initial SC2 cycle, the sa strobe odd signal is asserted along with the sci odd signal. The assertion of the sci odd signal at 407 causes the voltage levels present on two internal nodes, 327 and 329, in sense amplifier 205, to be provided to internal nodes 337 and 339 in sense amplifier 207. The assertion of the sa strobe odd signal at 405 causes the voltage values provided by transfer circuit 225 to be latched into sense amplifier 207. Thus, the value latched in master latch 205 is transferred in the initial SC2 cycle to slave latch 207.

The scan operation continues as follows. The assertion of the sci even pulse at 409 along with the assertion of sa strobe even at 411 causes the values in the slave latches, including latch 207 to be transferred into the adjacent even master sense amplifiers, including master 209 (see FIG. 2). The assertion of the sa strobe odd signal and sci odd signal at 413 and 415 respectively, transfers the values in the master latches to adjacent slave latches. The sequence of shifting data from master to slave and slave to master continues until the values are shifted out of the sense amplifiers onto a pin of the chip or into another internal scan string which can be subsequently retrieved by an external test apparatus.

FIG. 4 also illustrates the clocking scheme of the illustrated embodiment when the read address is an address which is mapped into odd columns and associated odd sense amplifiers. In that case the initial SC2 cycle is modified. The dotted line 404 indicates that the initial sa strobe even signal is not asserted as in the previous case. Additionally, assertion of the sa strobe odd signal is shifted to earlier into the initial SC2 cycle as shown by dotted line 406 so as to coincide with the assertion of the isolation strobe signal so the odd sense amplifiers can latch the values from the bit lines. The assertion of the sci odd signal 407 does not cause the values in the odd sense amplifiers to be affected by the voltage levels in the even sense amplifiers because of the relative beta values of the transistors. The sci odd signal at 407 could also be gated off to ensure that the odd sense amplifiers are isolated from the even sense amplifiers during the initial SC2 cycle as indicated by the dashed line 408.

Unlike the voltage values present on the true and complement bit lines provided to each sense amplifier, the voltage values present on the internal nodes of the sense amplifiers which are transferred via the transfer circuit are typically at a logic high and logic low voltage, e.g., approximately 3V ($V_{DD}$) and approximately 0V. Note that there is overlap between the odd and even sense amplifier strobes and the sci odd and even signals. That overlap may be, e.g., a 5 nanosecond overlap when the SC2 clocks are operating at 50 MHz and could be shorter for higher speed operation. Such an overlap in the illustrated embodiment is sufficient to transfer a stored value from one sense amplifier to an adjacent sense amplifier.

Figure 5:
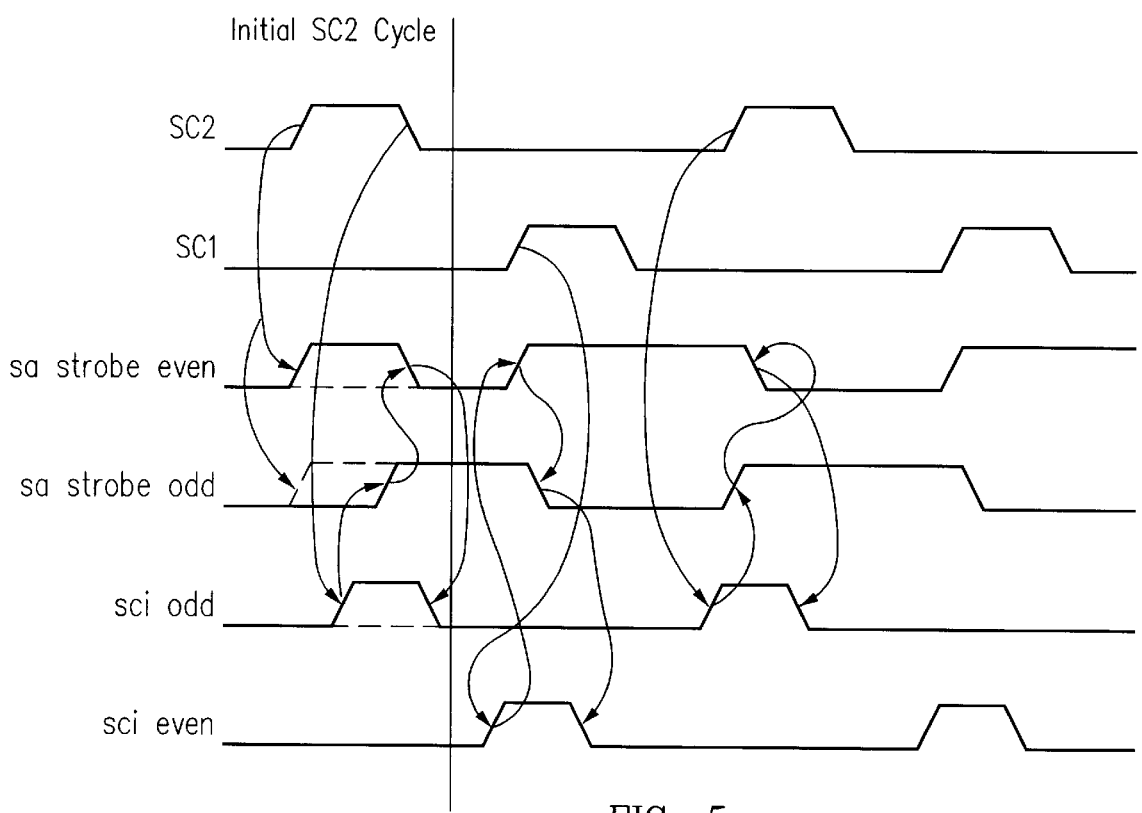
FIG. 5 shows the relationship between various edges of the clocks shown in FIG. 4.

FIG. 5 illustrates a clocking sequence for the relevant clocking signals. The sense amplifier strobe clocks and the sci odd and sci even signals, in the illustrated embodiment, are derived from the SC2 and SC1 scan clocks. The rising edge of the sense amplifier strobe even pulse (for addresses mapped to even sense amplifiers) follows the rising edge of the initial SC2 clock pulse. The rising edge of sci odd is gated by the falling edge of SC2 which causes sense amplifier strobe odd to rise which lets the even strobe fall. The rising edge of the SC1 clock causes the rising edge of the sci even pulse which allows sa strobe even to rise which, in turn, lets sense amp strobe odd to fall which lets sci even to fall. For the second SC2 cycle, the leading edge of SC2 is followed by the rising edge of sci odd which is followed by the rising edge of sense amplifier strobe odd. That rising edge allows the sa strobe even to fall which in turn allows the sci odd pulse to fall. The pulse width of the sci odd and sci even signals is not intended to be limited by the falling edge of the sa odd and even strobe pulses since the pulse width can of course be longer. The exact timing of the transfer clocks and sense amplifier latch strobes would be known to one of ordinary skill in the art based on the particular circuitry and clock speeds being utilized. FIG. 5 shows one timing approach that is appropriate for the illustrated embodiment at 50 MHz. The purpose for the interlocking signals shown in FIG. 5 is to give the design self tolerancing capability and margin to prevent negative overlap which could result in failure to transfer data.

The control logic, to supply the clocks in a test mode, can be readily derived from the timing diagrams shown. The control logic is located off-pitch, meaning that the control logic is not included in the columns of the array and therefore does not affect the density of the pitched cells of the array. The sci odd and sci even signals are turned off when the memory is being used during normal operations. The sense amp strobe signals are utilized during normal operations and will be activated according to the address that is being read.

Referring again to FIG. 3, the transfer circuits couple internal nodes of adjacent sense amplifiers in a symmetric manner. That means that the internal node coupled to the bit line true (btn), in one amplifier, e.g. node 327 is coupled to the bit line true (n+1) at internal node 337 in the adjacent amplifier via transistor 351 in transfer circuit 225. The internal node coupled to the bit line n complement (bcn), in one amplifier, e.g. node 329 is coupled to the bit line (n+1) complement internal node 339 in the adjacent amplifier via transistor 352 in the transfer circuit. The circuit may also be constructed by coupling a true node to an adjacent complement node and vice versa, e.g., node 327 to node 339 and node 329 to 337.

By coupling to the internal nodes of the sense amplifiers in the manner shown and described, the direction of transfer through the scan chain of sense amplifiers can be changed by applying clocks in a different sequence. Thus, while the description of the clocking sequence has described a serial transfer from left to right as shown in FIGS. 2 and 3, it is also possible to serially shift data from right to left. That would be accomplished by switching the sci odd and the sci even signals such that one is asserted in place of the other is asserted in FIG. 4. If bi-directional scanning capability is provided in the control logic, it would be possible to determine more information about the scan chain in the event a defect causes a break in the scan chain. The additional information can be obtained about the scan chain by shifting the other direction, thereby providing visibility into that part of the scan chain previously hidden due to the break.

Figure 6:
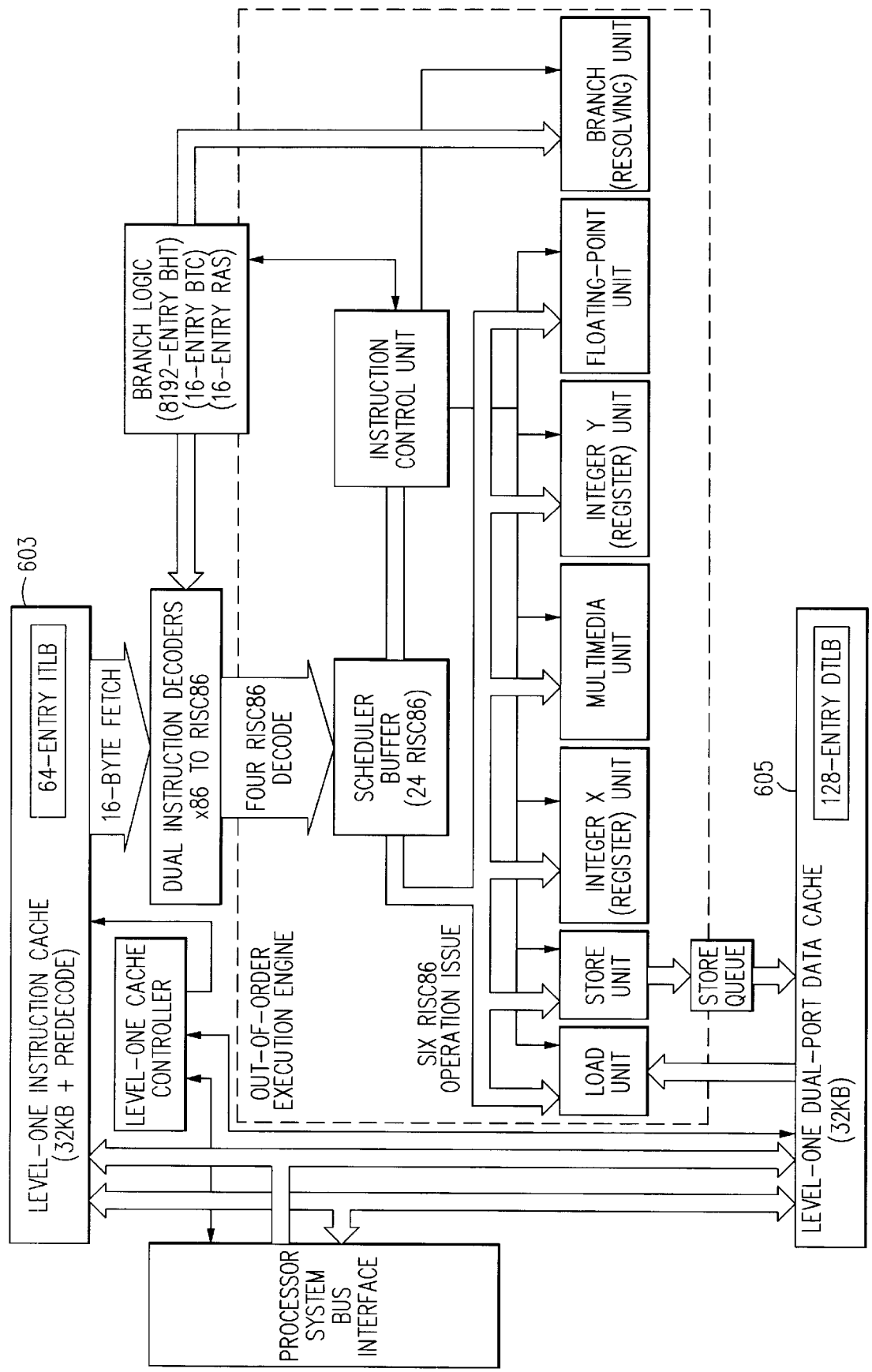
FIG. 6 shows an exemplary microprocessor integrated circuit in which the sense amplifiers and transfer circuits of the present invention may be advantageously employed.
Figure 7:
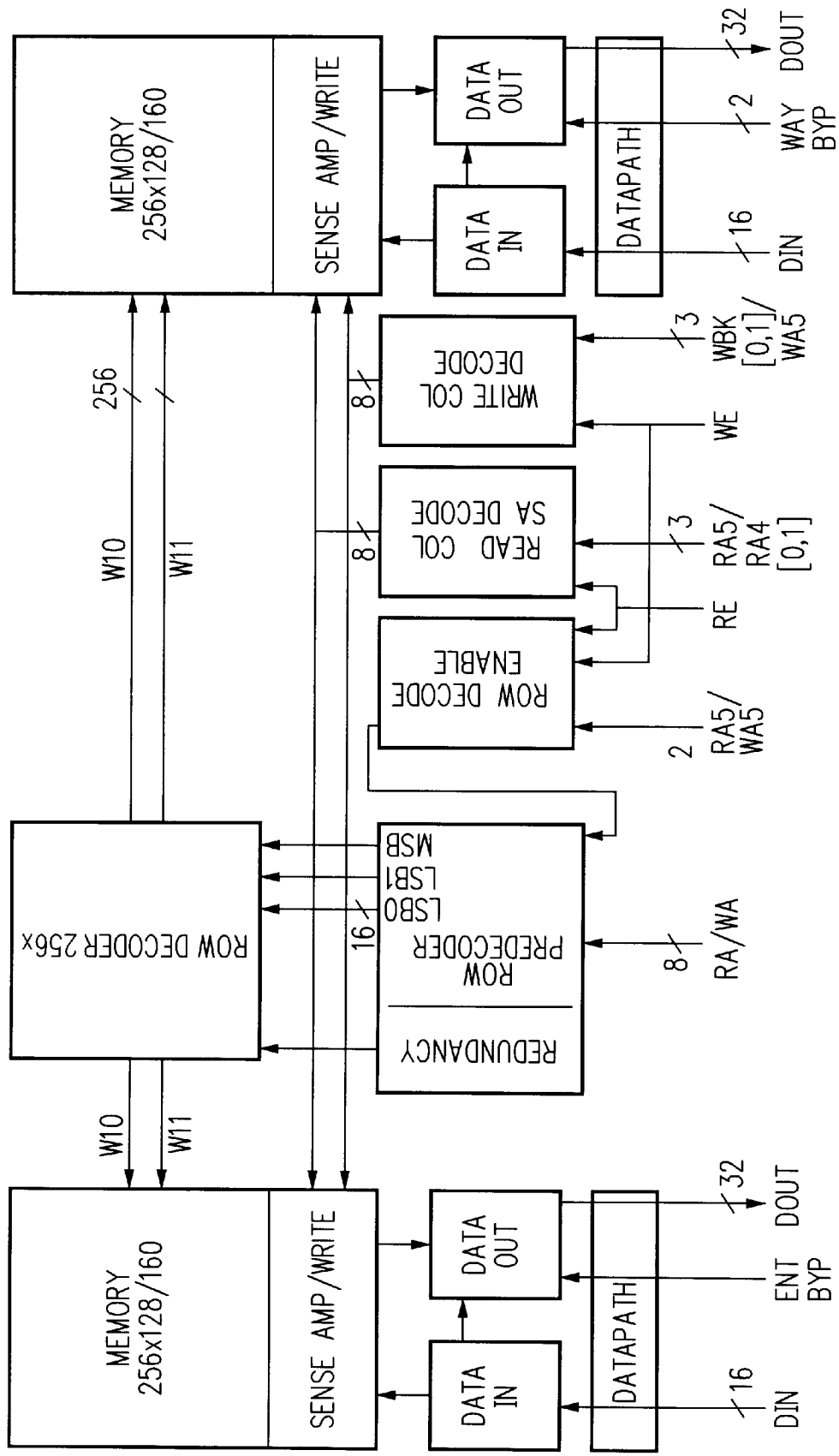
FIG. 7 shows a block diagram of one of the cache memories of the microprocessor of FIG. 6 utilizing the present invention.

In one embodiment of the invention, the memory array resides on an integrated circuit such as a microprocessor as data and/or instruction caches. That microprocessor may in turn be part of a computer system. Referring to FIG. 6, a microprocessor integrated circuit utilizing an embodiment of the sense amplifier scan circuits described herein is shown. The microprocessor integrated circuit includes instruction cache memory 603 and data cache memory 605. FIG. 7 shows a block diagram of one of the cache memories shown in FIG. 6. The scannable sense amplifiers described herein may be advantageously utilized in the cache memories shown in FIG. 6 to facilitate debug and testing of memory arrays. Scan of the sense amplifiers allows readout of the array data for debug and bitmap analysis. The invention described herein also allows for force out testability of the datapath logic.

A wide variety of computer systems may advantageously employ the scannable sense amplifiers disclosed herein. For example, one such computer system includes a microprocessor with at least one cache memory having the scannable sense amplifiers in accordance with the present invention, a bus coupling the microprocessor to other integrated circuits in the computer system, memory, and such input/output devices, disks, disk controllers, and other such devices and interfaces as may be found in conventional computer systems.

The scannable sense amplifiers disclosed herein may also be utilized effectively in SRAM and DRAM integrated circuit memory chips in addition to microprocessor integrated circuit chips.

Note that there may be extra transfer circuits, for example two transfer circuits and wire connections, where one group of sense amplifiers is physically separated from a next group of sense amplifiers such as between major sense amplifier groups. Where groups of sense amplifiers are widely separated, requiring particularly long wiring connections, additional circuitry may be required between such groups of sense amplifiers to achieve appropriate drive levels of the scan signals.

Figure 8A:
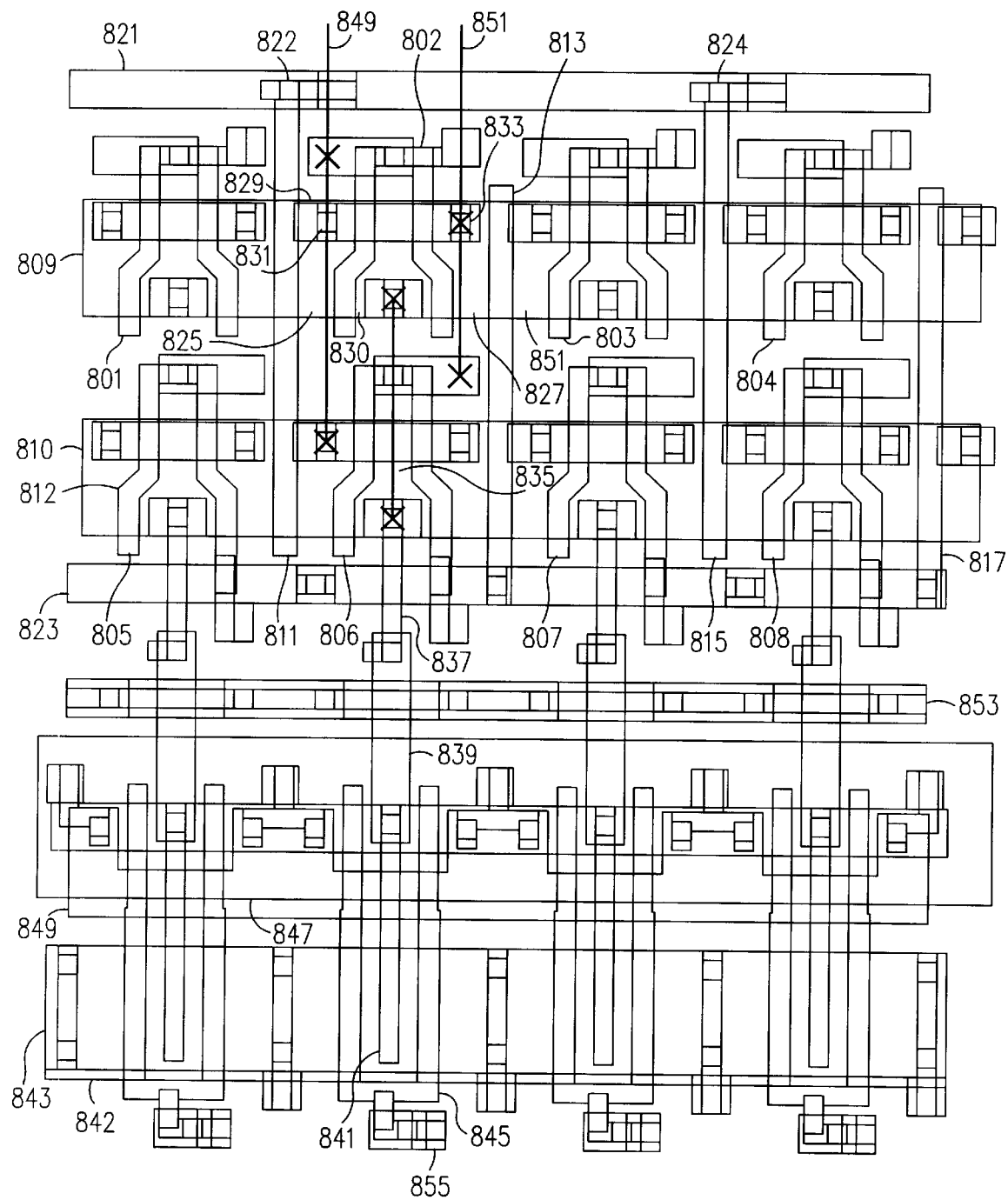
FIG. 8A shows a circuit layout of one portion of the sense amplifier and transfer circuits of the present invention and includes polysilicon, N-type and P-type active areas, local interconnects, first level metal and contacts, with the various features being identified with different fill patterns.
Figure 8B:
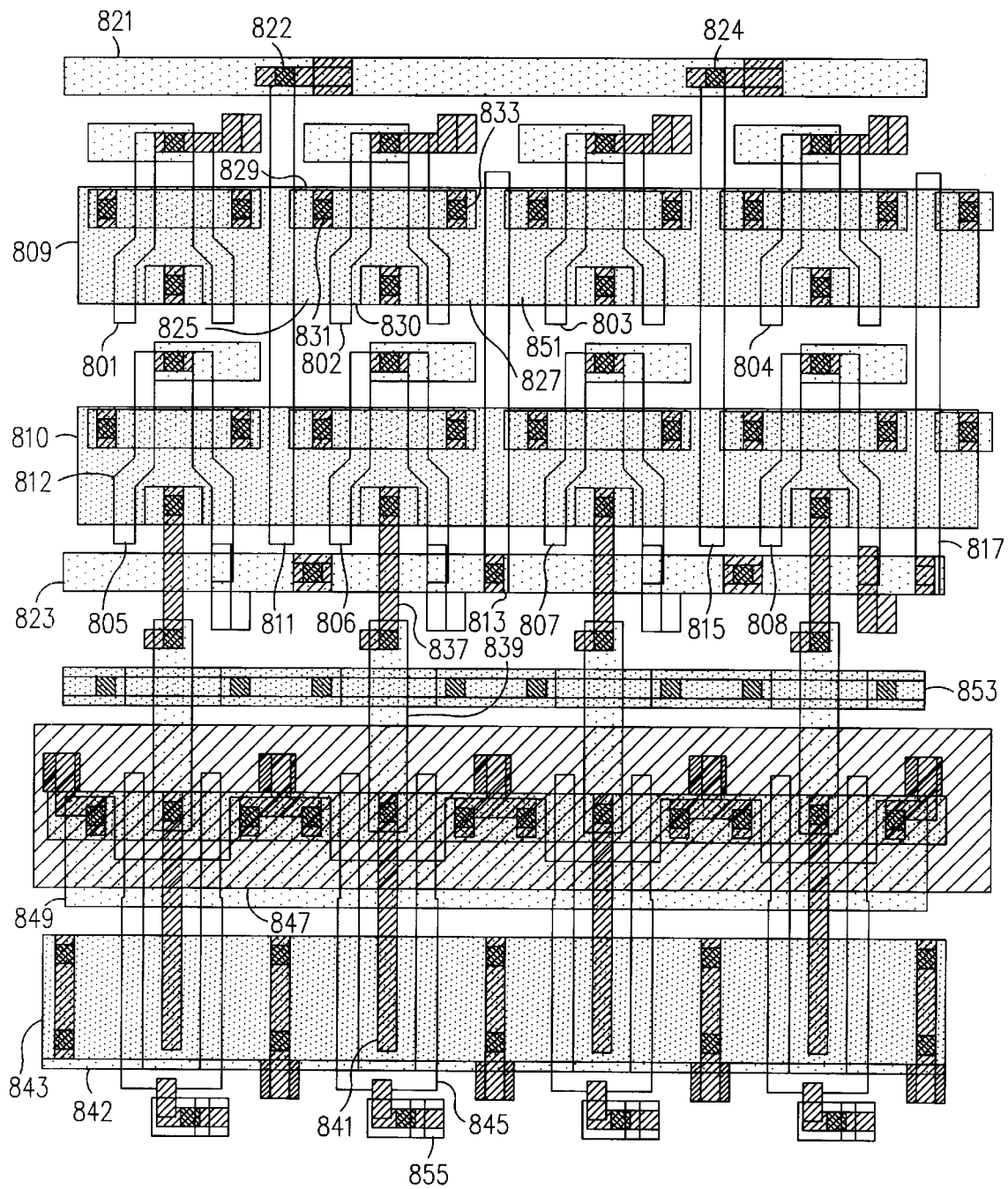
FIG. 8B shows the same features as FIG. 8A without any fill patterns to more easily identify features and to more easily show second level metal lines, where appropriate.

Referring to FIGS. 8A and 8B, one advantageous layout of one portion of the scannable sense amplifier of the present invention is shown. Generally U-shaped polysilicon regions 801 through 804 and 805 through 808 are arranged in two horizontal rows. Two regions of N-type active areas 809 and 810 extend horizontally and intersect the polysilicon structures 801–808 to form four pair of cross coupled transistors. A cross coupled pair corresponds to, e.g., transistors 303 and 305 shown in FIG. 3. Separating each pair of cross coupled transistors and intersecting both active areas 809 and 810 are polysilicon regions 811, 813, 815 and 817. The intersection of the two active areas 809 and 810 with each vertical stripe of polysilicon (811, 813, 815 and 817) forms the two NMOS transistors of the transfer circuit. Alternate ones of the polysilicon structures 811 and 815 are coupled to a metal line 821 at contacts 822 and 824 respectively. The metal line 821 corresponds to the sci odd signal 235. The even polysilicon structures 813 and 815 are connected to metal line 823 which corresponds to sci even signal 237. Note that while the legs of the U-shaped polysilicon regions forming the cross coupled NMOS transistors extend generally in a vertical direction, a forty five degree bend, e.g. at 812, is present in the legs of the structure of the illustrated embodiment.

An exemplary pair (of the four pair shown) of the NMOS cross coupled transistors formed with polysilicon regions 802 and 806 will be discussed in further detail. There are two drain regions of the transistor formed with polysilicon structure 802. The first drain region 825 is formed in the active area 809 bounded by the polysilicon vertical strip 811 and the adjacent leg of polysilicon structure 802. The second drain region 827 is formed in active area 809 and is bounded by the adjacent leg (i.e. the other leg) of polysilicon structure 802 and the vertical polysilicon strip 813. Note that the true and complement regions represented by the drains of the cross coupled transistors should be closely matched in terms of area. Thus, drain regions 825 and 827 should be closely matched to corresponding regions in the other transistor of the cross coupled pair. The two drain regions 825 and 827 are coupled together through small regions of local interconnect, contacts 831 and 833 and first level metal line 829.

The source region 830 of each cross coupled transistor is inside the U-shape and bounded by the legs of the U. The other transistor of the cross coupled transistor pair is displaced vertically below the first transistor of the pair and is formed using U-shaped polysilicon structure 806 and is similarly connected.

Note that the use of the terms drain and source are used in a conventional manner. The current handling terminal having a lower voltage is typically designated the source while the current handling terminal normally residing at the higher voltage is customarily called the drain. The terms are used herein for convenience in identifying particular areas of the structures being discussed and may also be referred as a source/drain region or drain/source region, especially where it is unclear which current handling terminal of the transistor has the higher voltage.

Referring to FIG. 8, the source regions of both cross coupled transistors are coupled together by a second level metal line 835. The second level metal lines are shown as lines which are connected to underlying layers at X's. The local interconnect 837, which may be a tungsten silicide, first level metal layer 839 and local interconnect 841 couple the sources of the cross coupled transistors to the latch transistor which corresponds to latching transistor 308 in FIG. 3. The latch transistor is formed in N-type active area 843 with polysilicon structure 845. A first level metal layer 842 provides a connection to $V_{SS}$.

The cross coupling of the two NMOS transistors is accomplished by second level metal lines 849 and 851 (shown in FIG. 8B) which couple to the polysilicon structure 802 and the drain of the transistor formed with polysilicon structure 806. Metal line 851 couples the drain region 827 with the polysilicon structure 806 at the contacts indicated by X's, thus coupling the drain to the gate. The second level metal lines 849 and 851 extend to interconnect with isolation transistors 341 and 342 and the sense amplifier equilibrate transistors 343 and 344. Note that the second level metal lines shown are shown solely for purposes of illustrating electrical connections and the second level metal lines may extend further than shown to provide capacitive balancing. The pull-up transistor 311 is formed by the interconnection of polysilicon structure 845 and P-active area 849. A first level metal layer 847 provides $V_{DD}$.

The source/drain regions of the transistors forming the transfer circuits are common with the drain regions of the cross coupled NMOS transistors. Thus, the drain region 827 also provides a source/drain region for the transistor formed by vertical polysilicon structure 813 intersecting with active area 809. Similarly, the drain region 851 of the adjacent sense amplifier provides the source/drain region for that transistor.

The polysilicon strip 853 with associated contacts and local interconnects provide a guard ring for the cross coupled latches of the sense amplifier. Gate tie down diodes are utilized, such as gate tie down diode 855, to prevent breakdown of dielectric on floating polysilicon during plasma etching operations.

The vertical stripes of polysilicon forming the NMOS transistors of the transfer circuit replace what otherwise would have to be an isolation region formed as a shallow trench or field oxidation region. The isolation region would be needed to isolate adjacent sense amplifiers from each other. Since the two NMOS transistors are normally off, i.e., their gates are tied to ground, except during debugging or testing operation, the NMOS transistors of the transfer circuit function both to isolate the sense amplifiers as well as provide a way to implement master/slave flip-flops and thus provide a very low cost on-pitch scannable sense amplifier.

The channel length of the NMOS transistors, i.e., the width of the vertical polysilicon strips 811, 813, 815 and 817, may be longer than the channel length of the cross coupled NMOS transistors. A transistor with a longer channel length has a voltage threshold value greater than a shorter channel length transistor, thus more effectively isolating adjacent sense amplifiers.

Figure 9A:
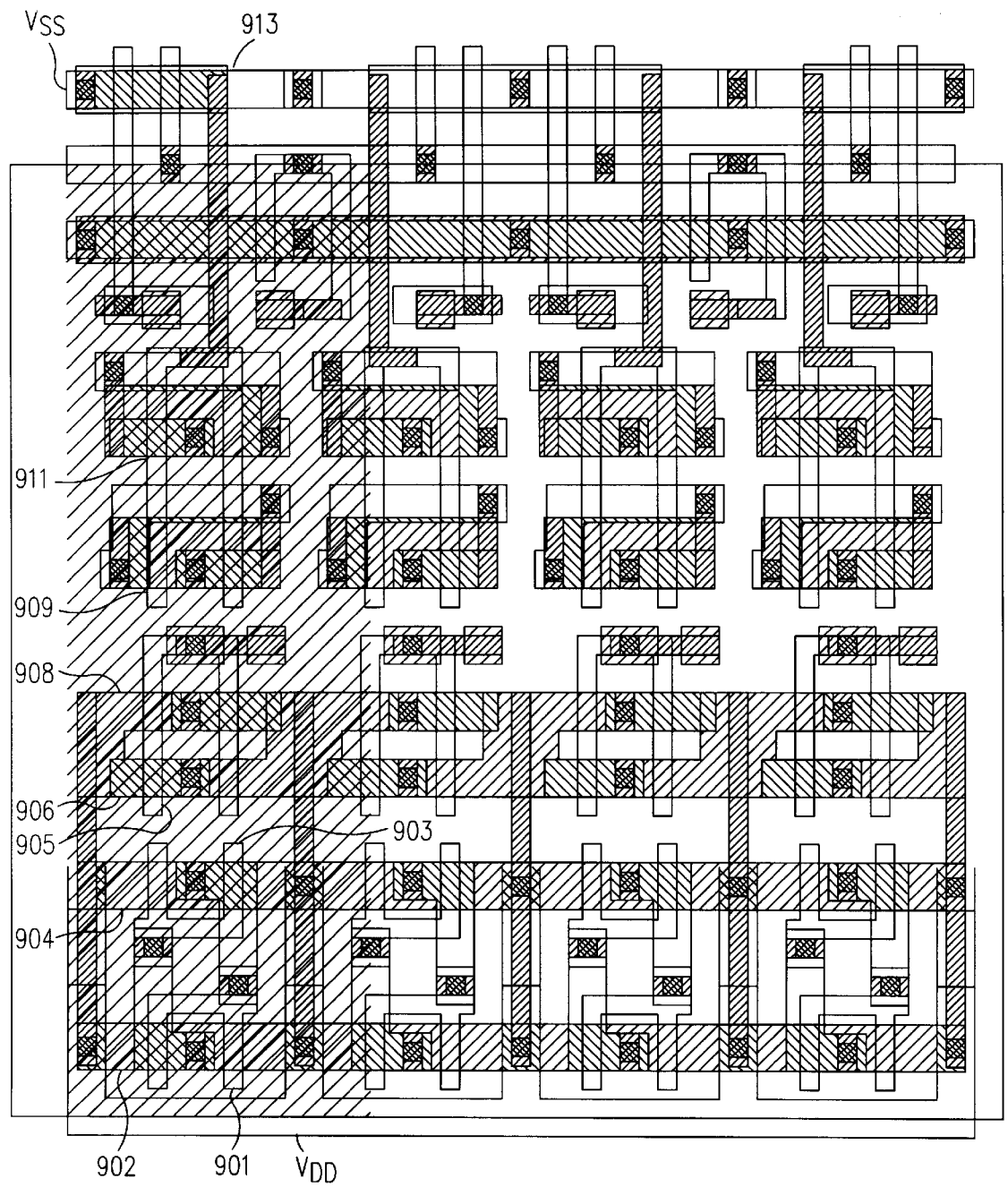
FIG. 9A shows additional portions of the layout of the sense amplifier and includes polysilicon, N-type and P-type active areas, local interconnects, first level metal and contacts, with the various features being identified with different fill patterns.
Figure 9B:
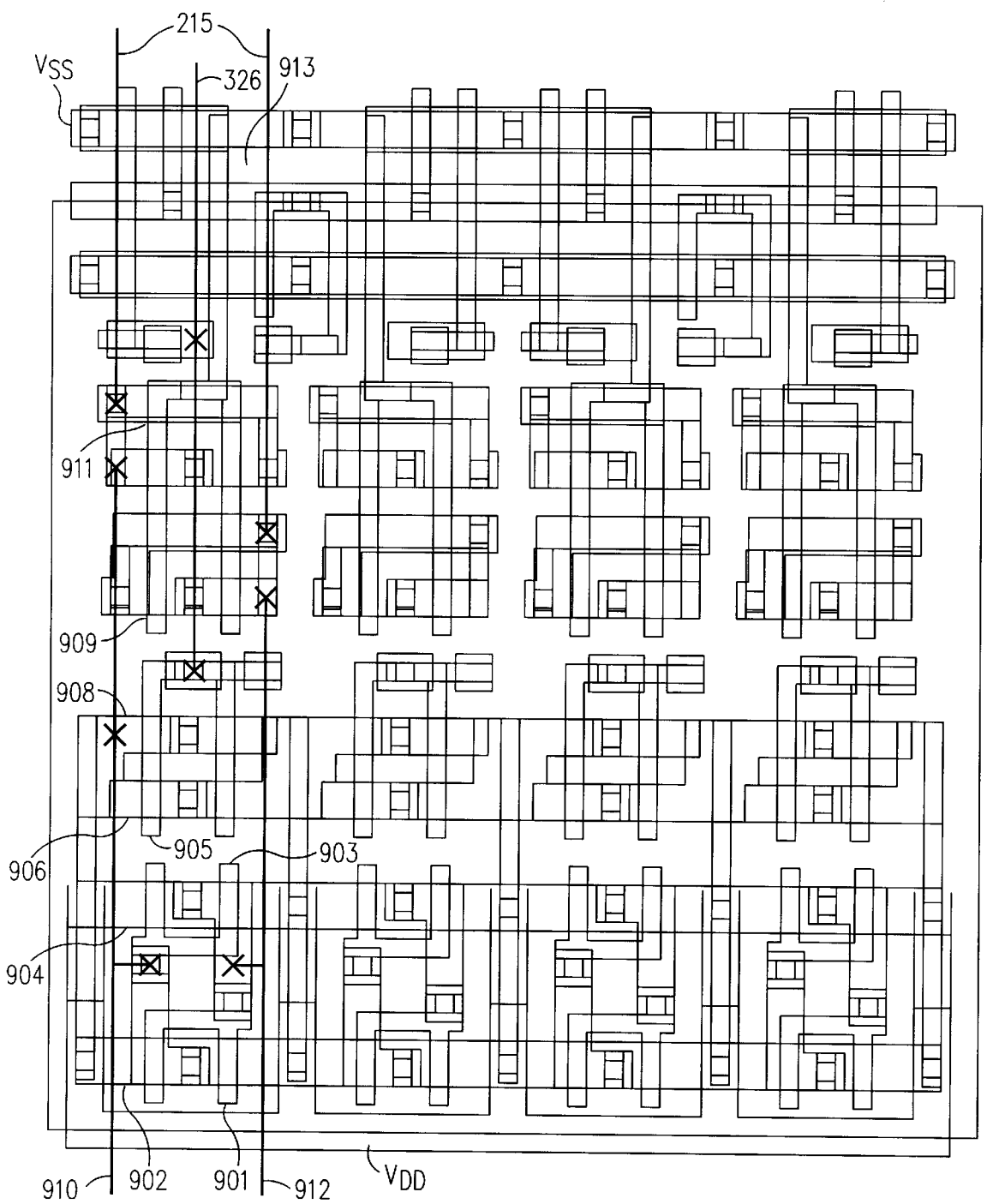
FIG. 9B shows the same features as FIG. 9A without any fill patterns to more easily identify features and to more easily show second level metal lines, where appropriate.

Referring to FIGS. 9A and 9B, the layout of an additional portion of the sense amplifier shown in FIG. 3, is illustrated. The cross coupled PMOS load transistors 307 and 309 are formed at polysilicon structures 901 and 903 intersecting with P-type active regions 902 and 904. The equilibrate transistors 343 and 344 are formed at the intersection of U-shaped polysilicon structure 905 and P-type active regions 906 and 908. The isolation transistors 341 and 342 correspond to the structures 909 and 911. NAND gate 340 is formed by the structures at 913. The second level metal lines are shown in FIG. 9B with connections indicated at X's. The second level metal lines 910 and 912 correspond to the second level metal lines 849 and 851, except they are shifted over by one transistor.

The description of the invention set forth herein is illustrative, and is not intended to limit the scope of the invention as set forth in the following claims. For instance while the transfer gates have been described as NMOS, in certain embodiments, they could also be PMOS. Variations and modifications of the embodiments disclosed herein, may be made based on the description set forth herein, without departing from the scope and spirit of the invention as set forth in the following claims.

What is claimed is:

1. An apparatus comprising:
   a plurality sense amplifiers, each of said sense amplifiers having a first and second internal node representing respectively, true and complement values of a latched value; and
   a plurality of transfer circuits, one of said transfer circuits disposed between and coupled to each adjacent pair of said sense amplifiers, said transfer circuits transferring said true and complement values between a previous and a next sense amplifier; wherein
   said sense amplifiers are alternately grouped as even sense amplifiers and odd sense amplifiers and are coupled to respective columns of a memory array and are coupled to form a scan chain via said transfer circuits, each of said odd sense amplifiers being coupled to latch a sensed value on assertion of a first clock signal and each of said even sense amplifiers being coupled to latch a sensed value on assertion of a second clocks signal; and
   a first group of said transfer circuits are coupled to a first transfer signal and a second group of said transfer circuits are coupled to a second transfer signal, and wherein said first and second transfer signals are asserted to transfer data from said previous to said next sense amplifier in said scan chain, and said first and second clock signals are asserted to latch said transferred data into respective sense amplifiers.

2. An apparatus as recited in claim 1 wherein each of said transfer circuits is comprised of two NMOS transistors.

3. The apparatus as recited in claim 1 wherein each of said sense amplifiers includes a latching circuit, and wherein each latching circuit is coupled to one of said first and second clock signals.

4. An apparatus as recited in claim 1 wherein each of said sense amplifiers comprises:
   a first and second transistor coupled as a cross coupled pair, a first electrode of said first transistor being coupled to a gate electrode of said second transistor, and a first electrode of said second transistor being coupled to a gate electrode of said first transistor and wherein said gate electrodes of said first and second transistors are respectively coupled to first and second bit lines through isolation transistors;
   a latch transistor having a gate electrode coupled to one of said first and second clock signals, said latch transistor having a first electrode coupled to second electrodes of said first and second transistors and having a third electrode coupled to ground; and wherein
   each said transfer circuit comprises a first transfer transistor and a second transfer transistor, said first transfer transistor being coupled to said gate electrode of said first transistor on each sense amplifier adjacent to said transfer circuit, and wherein said second transfer transistor is coupled to said gate electrode of said second transistor on each said sense amplifier adjacent to said transfer circuit, and wherein said gate electrodes of said first and second transfer transistors are coupled to one of said first and second transfer signals.

5. The apparatus of claim 4 wherein said cross coupled pair, said latch transistor and said first and second transfer transistors are NMOS transistors.

6. The apparatus as recited in claim 1 wherein said apparatus is one of an SRAM integrated circuit and a DRAM integrated circuit.

7. An apparatus comprising:
   a plurality sense amplifiers, each of said sense amplifiers having a first and second internal node representing respectively, true and complement values of a latched value; and
   a plurality of transfer circuits, one of said transfer circuits disposed between and coupled to each adjacent pair of said sense amplifiers, said transfer circuits transferring said true and complement values between a previous and a next sense amplifier;
   wherein each said sense amplifier comprises:
   a latching circuit, each latching circuit being coupled to one of said first and second clock signals;
   a first transistor having a first and second electrode, and a first gate electrode, said first electrode being coupled to a supply voltage;
   a second transistor having a third and fourth electrode and a second gate electrode, said third electrode being coupled to said supply voltage, said first and second gate electrodes being coupled respectively to first and second bit lines through isolation transistors, said first bit line representing a true value of a value stored said array and said second bit line representing a complement value of said value stored in said array, said second electrode of said first transistor being coupled to said second bit line at a first internal node in said sense amplifier, and said fourth electrode of said second transistor being coupled to said first bit line at a second internal node in said sense amplifier;

a third transistor having a fifth and sixth electrode and a third gate electrode, said fifth electrode being coupled to said first internal node and said third gate electrode being coupled to said second internal node;

a fourth transistor having a seventh and eighth electrodes and a fourth gate electrode, said seventh electrode being coupled to said second internal node and said fourth gate electrode being coupled to said first internal node; and wherein said latching circuit comprises a fifth transistor having a ninth and a tenth electrode and a fifth gate electrode, said ninth electrode being coupled to said sixth and eighth electrodes and said tenth electrode being coupled to ground, and wherein said fifth gate electrode is coupled to one of said first and second clock signals.

8. The apparatus as recited in claim 7 wherein each said transfer circuit comprises a sixth and seventh transistor, said sixth transistor having eleventh and twelfth electrodes and a sixth gate electrode, and said seventh transistor having thirteenth and fourteenth electrodes and a seventh gate electrode, said sixth and seventh gate electrodes being coupled to one of said first and second transfer signals, and wherein eleventh and twelfth electrodes are coupled to first internal nodes in adjacent sense amplifiers and wherein said thirteenth and fourteenth electrodes are coupled to said second internal nodes in adjacent sense amplifiers.

9. The apparatus as recited in claim 8 wherein said first and second transistors are PMOS and said fourth through seventh transistors are NMOS.

10. An apparatus comprising:

a plurality of transfer circuits;

a plurality of sense amplifiers coupled to a storage array, each of said sense amplifiers being coupled to a next one of said sense amplifiers via one of said transfer circuits to form a scan chain, each of said sense amplifiers having a latching circuit, and wherein a first group of latching circuits in odd numbered sense amplifiers in said scan chain are coupled to a first clock signal and a second group of latching circuits in even numbered sense amplifiers in said scan chain are coupled to a second clock signal;

a first transfer signal coupled to even numbered transfer circuits; and a second transfer signal coupled to odd numbered transfer circuits.

11. An apparatus as recited in claim 10, wherein for each internal sense amplifier in said scan chain, said internal sense amplifier being coupled to two transfer circuits, each internal sense amplifier has a first node coupled to a true bit line and a second node coupled to a complement bit line, and wherein each of said first and second nodes are connected to respective nodes of an upstream and downstream transfer circuit.

12. The apparatus as recited in claim 10 wherein said next one of said sense amplifiers is physically adjacent to a previous one of said sense amplifiers with a transfer circuit disposed between said previous and said next one.

13. The apparatus as recited in claim 10 wherein data is transferred in a first direction in said scan chain upon application of a first sequence of said first, second, third and fourth clocks and wherein data is transferred in a second direction in said scan chain upon application of a second sequence of said first, second, third and fourth clocks, thereby providing for bi-directional shifting through said scan chain.

14. A method of scanning a plurality of sense amplifiers of a memory array coupled in a scan chain, said plurality of sense amplifiers including a first group of sense amplifiers and a second group of sense amplifiers, each of said sense amplifiers being coupled to a next one of said sense amplifiers via a respective one of a plurality of transfer circuits, said transfer circuits including a first group and a second group, said method comprising:

asserting a first transfer signal coupled to said first group of transfer circuits to provide a first group of signals respectively held in said first group of sense amplifiers to said second group of sense amplifiers; and asserting a second sense amplifier clock to store respective ones of said first group of signal values into said second group of sense amplifiers, thereby shifting said first group of signals from said first group of sense amplifiers to said second group of sense amplifiers.

15. The method as recited in claim 14 further comprising:

asserting, prior to assertion of said first transfer signal, a first sense amplifier clock to store said first group of signal values representing logic levels stored in said memory array into said first group of sense amplifiers.

16. The method as recited in claim 14 further comprising:

asserting a second transfer signal coupled to said second group of transfer circuits to provide a second group of signals from said second group of sense amplifiers to said first group of sense amplifiers; and asserting a first sense amplifier clock to store said second group of signals into said first group of sense amplifiers, thereby shifting said respective signals from said second group of sense amplifiers to said first group of sense amplifiers.

17. The method as recited in claim 14 wherein at least one of said first and second transfer signals and at least one of said first and second sense amplifier clocks are asserted so as to overlap for at least a portion of an active period of respective ones of said transfer signals and said clocks.

* * * * *